(12) United States Patent
Jones (10) Patent No.: US 7,863,133 B2
(45) Date of Patent: Jan. 4, 2011

(54) OXIDE EPITAXIAL ISOLATION

(75) Inventor: Lyle Jones, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 12/367,409

(22) Filed: Feb. 6, 2009

(65) Prior Publication Data

US 2009/0142893 A1    Jun. 4, 2009

Related U.S. Application Data

(62) Division of application No. 11/168,855, filed on Jun. 28, 2005, now Pat. No. 7,504,685.

(51) Int. Cl.
*H01L 21/336* (2006.01)
(52) U.S. Cl. .............. 438/257; 257/E21.688; 257/E21.687; 257/E21.68; 257/E21.422; 257/E21.179
(58) Field of Classification Search ......... 438/257; 257/133, 314, 315, 401, E21.688, E21.687, 257/E21.68, E21.422, E21.179, E29.3, E29.129
See application file for complete search history.

(56) References Cited

U.S. PATENT DOCUMENTS

| | | | |
|---|---|---|---|
| 4,759,821 A | 7/1988 | Knoedler et al. | |
| 4,847,670 A | 7/1989 | Monkowski et al. | |
| 4,957,875 A | 9/1990 | Akbar et al. | |
| 4,982,257 A | 1/1991 | Akbar et al. | |
| 5,059,544 A | 10/1991 | Burghartz et al. | |
| 5,064,772 A | 11/1991 | Jambotkar | |
| 5,101,256 A | 3/1992 | Harame et al. | |
| 5,128,271 A | 7/1992 | Bronner et al. | |
| 5,137,840 A | 8/1992 | Desilets et al. | |
| 5,235,206 A | 8/1993 | Desilets et al. | |
| 5,244,824 A | 9/1993 | Sivan | |
| 5,312,782 A | 5/1994 | Miyazawa | |
| 5,321,285 A | 6/1994 | Lee et al. | |
| 5,331,199 A | 7/1994 | Chu et al. | |
| 5,446,312 A | 8/1995 | Hsieh et al. | |
| 5,451,538 A | 9/1995 | Fitch et al. | |
| 5,521,399 A | 5/1996 | Chu et al. | |
| 5,547,893 A | 8/1996 | Sung | |
| 5,581,101 A | 12/1996 | Ning et al. | |
| 5,583,059 A | 12/1996 | Burghartz | |
| 5,583,368 A | 12/1996 | Kenney | |
| 5,637,518 A | 6/1997 | Prall et al. | |
| 5,677,573 A | 10/1997 | Prall et al. | |

(Continued)

OTHER PUBLICATIONS

Deffree, Susan, "IBM proves vertical transistor DRAM at 70nm", *Electronic News*, (Jun. 10, 2003), 2 pgs.

(Continued)

*Primary Examiner*—Davienne Monbleau
*Assistant Examiner*—Monica D Harrison
(74) *Attorney, Agent, or Firm*—Schwegman, Lundberg & Woessner, P.A.

(57) ABSTRACT

Non-volatile memory cell structures are described that are formed by a method including forming a first oxide layer on a horizontal strained substrate, forming at least one first recess through the first oxide layer to the strained substrate, and forming at least one vertical epitaxial structure in the recess. A crystal lattice of the vertical epitaxial structure is aligned with a crystal lattice of the strained substrate.

20 Claims, 10 Drawing Sheets

U.S. PATENT DOCUMENTS

| | | |
|---|---|---|
| 5,723,370 A | 3/1998 | Ning et al. |
| 5,831,334 A | 11/1998 | Prall et al. |
| 5,963,800 A | 10/1999 | Augusto |
| 5,998,844 A | 12/1999 | Prall et al. |
| 6,027,975 A | 2/2000 | Hergenrother et al. |
| 6,057,200 A | 5/2000 | Prall et al. |
| 6,127,242 A | 10/2000 | Batra et al. |
| 6,157,058 A | 12/2000 | Ogura |
| 6,159,852 A | 12/2000 | Nuttall et al. |
| 6,168,995 B1 | 1/2001 | Kelley et al. |
| 6,197,641 B1 | 3/2001 | Hergenrother et al. |
| 6,251,693 B1 | 6/2001 | Nuttall et al. |
| 6,261,894 B1 | 7/2001 | Mandelman et al. |
| 6,303,425 B1 | 10/2001 | Maeda et al. |
| 6,309,919 B1 | 10/2001 | Liu et al. |
| 6,316,309 B1 | 11/2001 | Holmes et al. |
| 6,326,275 B1 | 12/2001 | Harrington et al. |
| 6,335,239 B1 | 1/2002 | Agahi et al. |
| 6,387,716 B1 | 5/2002 | Nuttall et al. |
| 6,391,695 B1 | 5/2002 | Yu et al. |
| 6,391,782 B1 | 5/2002 | Yu et al. |
| 6,399,979 B1 | 6/2002 | Noble et al. |
| 6,417,015 B2 | 7/2002 | Nuttall et al. |
| 6,458,699 B1 | 10/2002 | Nuttall et al. |
| 6,509,239 B1 | 1/2003 | Nuttall et al. |
| 6,518,622 B1 | 2/2003 | Chew et al. |
| 6,603,168 B1 | 8/2003 | Choi |
| 6,630,699 B1 | 10/2003 | Wylie |
| 6,635,924 B1 | 10/2003 | Hergenrother et al. |
| 6,653,181 B2 | 11/2003 | Hergenrother et al. |
| 6,656,809 B2 | 12/2003 | Greenberg et al. |
| 6,686,604 B2 | 2/2004 | Layman et al. |
| 6,687,146 B2 | 2/2004 | Kurjanowicz et al. |
| 6,790,722 B1 | 9/2004 | Divakaruni et al. |
| 6,794,699 B2 | 9/2004 | Bissey et al. |
| 6,803,642 B2 | 10/2004 | Freeman et al. |
| 6,812,504 B2 | 11/2004 | Bhattacharyya |
| 6,812,533 B2 | 11/2004 | Cai et al. |
| 6,812,545 B2 | 11/2004 | Dunn et al. |
| 6,849,871 B2 | 2/2005 | Ning |
| 6,864,517 B2 | 3/2005 | Freeman |
| 6,864,560 B2 | 3/2005 | Khater et al. |
| 6,888,221 B1 | 5/2005 | Joseph et al. |
| 7,282,410 B2 | 10/2007 | Lu et al. |
| 7,372,091 B2 | 5/2008 | Leslie |
| 2002/0089038 A1 | 7/2002 | Ning |
| 2002/0131291 A1 | 9/2002 | Kurjanowicz et al. |
| 2002/0171107 A1 | 11/2002 | Cheng et al. |
| 2003/0042531 A1 | 3/2003 | Lee et al. |
| 2003/0057477 A1 | 3/2003 | Hergenrother et al. |
| 2004/0119136 A1 | 6/2004 | Cai et al. |
| 2004/0152269 A1 | 8/2004 | Hergenrother et al. |
| 2005/0087805 A1 | 4/2005 | Ning |
| 2005/0164454 A1 | 7/2005 | Leslie |
| 2006/0006444 A1 | 1/2006 | Leslie |
| 2006/0289923 A1 | 12/2006 | Jones |

OTHER PUBLICATIONS

Geppert, Linda, "The Amazing Vanishing Transistor Act", *IEEE Spectrum*, (Oct. 2002), 7.

Geppert, Linda, "Triple Gate Double Play: Transistors with three gates and 3-D geometries will replace today's devices in a few years", *IEEE Spectrum*, (Nov. 2002), 18.

Hergenrother, J M, et al., "The vertical replacement-gate (VRG) MOSFET: a 50-nm vertical MOSFET with lithography-independent gate length", *Bell Laboratories, Lucent Technologies, Murray Hill*, 4pgs.

ISA "IBM claims speediest silicon transistor", http://www.isa.org/Template.cfm?Section=Communities&template=/TaggedPage/DetailDisplay.cfm&ContentID=20445, ISA—The Instrumentation, Systems and Automation Society, (Nov. 4, 2002), 2 pgs.

Lucent Technologies, "Revolutionary transistor design turns the silicon world on end", http://www.bell-labs.com/news/1999/november/15/1.html, Lucent Technologies, Bell Labs Innovations, (1999), 3 pgs.

Lucent Technologies, "Revolutionary transistor turns silicon world on end", (2000), 2 pgs.

Ning, T H, "Why BiCMOS and SOI BiCMoS?", *IBM*, 0018-8646, (Nov. 29, 2001), 7 pgs.

OXIDE EPITAXIAL ISOLATION

RELATED APPLICATION

This application is a Divisional of U.S. application Ser. No. 11/168,855, filed Jun. 28, 2005 now U.S. Pat. No. 7,504,685, which is incorporated in its entirety herein by reference.

TECHNICAL FIELD

The field generally relates to manufacturing of integrated circuits, and in particular to forming vertical epitaxial structures for non-volatile memory cells.

BACKGROUND

Integrated circuits are often formed using fabrication steps that include diffusion processes. Photolithography is one method used to diffuse impurities into silicon to create regions of differing doping densities. Diffusion processes can leave impurity concentrations that make it difficult to manage concentration profiles and can result in lower resistivities which lead to less than optimal breakdown voltages for isolating structures.

Epitaxial or "epi" layers have a much lower level of impurities than diffused layers. Epi layers are layers of semiconductor material having the same crystalline orientation as the host substrate on which it is grown—i.e., the epi layer is a single-crystal layer having a constant doping profile (unlike that created by diffusion or implantation) which is necessary for the formation of some semiconductor devices. One result is that an epi layer has a higher resistivity than typical diffused or implanted layers. Some epi layers are deposited after initial diffusion processes to leave a "buried layer" often used in making integrated circuits such as bipolar junction transistors (BJTs). Processes that create a single-crystal epitaxial layer from deposited material are somewhat complex and involve the use of a "seed crystal" that allows an annealing process to align the crystals of the deposited material to create a single-crystal material from deposited (non-single-crystal) material.

Designers of integrated fabrication processes continuously strive to reduce device feature sizes; especially in the area of memory devices. The present inventor has recognized a need for improved feature sizes of isolation structures in the fabrication of integrated circuits.

SUMMARY

This document discusses, among other things, apparatuses having reduced feature sizes of integrated circuit structures and methods for forming such structures. An apparatus embodiment has a horizontally strained substrate and at least one vertical epitaxial isolation structure extending from the substrate through a layer of insulating oxide formed on the substrate for forming structures in a non volatile memory. The crystal lattice of the vertical epitaxial structure is aligned with the crystal lattice of the substrate. Additionally, the apparatus includes a transistor formed as part of a flash memory cell in an active region defined within the vertical epitaxial isolation structures. The transistor includes first source/drain region adjacent a first wall of the insulating layer, a second source/drain region adjacent a second wall of the insulating layer, and a channel region between the first source/drain region and the second source/drain region.

A method embodiment includes forming a first oxide layer on a horizontal strained substrate, forming at least one first recess through the first oxide layer to the strained substrate, and forming at least one vertical epitaxial structure in the recess as part of a non-volatile memory. A crystal lattice of the vertical epitaxial structure is aligned with a crystal lattice of the strained substrate.

This summary is intended to provide an overview of the subject matter of the present patent application. It is not intended to provide an exclusive or exhaustive explanation of the invention. The detailed description is included to provide further information about the subject matter of the present patent application.

DETAILED DESCRIPTION

In the following detailed description, reference is made to the accompanying drawings which form a part hereof, and specific embodiments in which the invention may be practiced are shown by way of illustration. It is to be understood that other embodiments may be used and structural or logical changes may be made without departing from the scope of the present invention. The present description of the embodiments further make use of terms such as horizontal, vertical, top, bottom, up, down and words of similar import. These terms are meant to refer to orientation of the described element relative to a base substrate such as a wafer.

The terms "wafer" and "substrate" used in the following description include any structure having an exposed surface with which to form an integrated circuit (IC) structure or a micro electromechanical (MEM) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors.

This document discusses methods and apparatuses for reduced feature sizes of integrated circuit isolating structures.

Figure 1A:
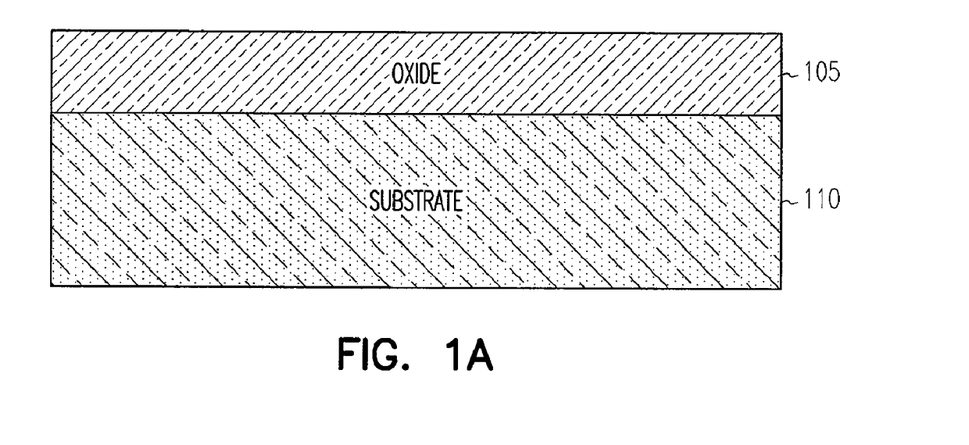
FIGS. 1A-D are illustrations of embodiments of semiconductor layers used in fabricating a flash memory integrated circuit.

One application of these structures is for forming non-volatile memory structures. One type of non-volatile memory is flash memory. FIGS. 1A-D are illustrations of semiconductor layers used in fabricating an integrated circuit. FIG. 1A is a cross sectional illustration of an insulating oxide layer 105 formed on a substrate 110. In some embodiments, the oxide layer 105 is formed by a deposition process. In some embodiments, the oxide layer 105 is formed on a substrate 110 that is "strained" to change the crystal lattice of the substrate 110 at least at the surface of the substrate 110. In some embodiments, the substrate 110 is strained by forming the substrate 110 in a volume small enough to change its crystal lattice. In some embodiments, the substrate 110 is strained by forming a silicon substrate 110 on a first silicon germanium substrate that has a dissimilar lattice structure. In an example, the substrate 110 is strained in the horizontal direction.

Figure 1B:
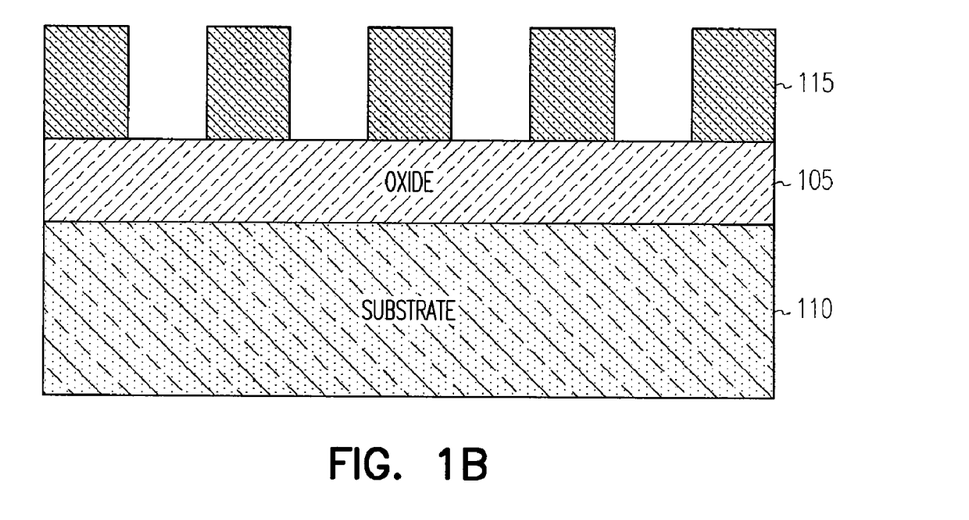
Figure 1C:
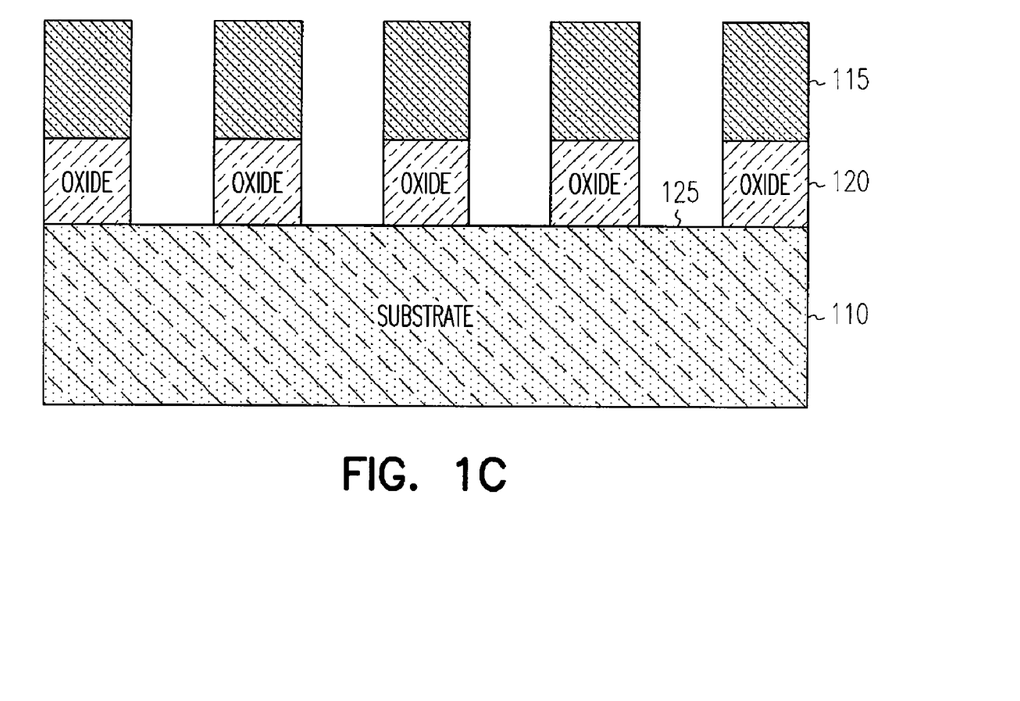
Figure 1D:
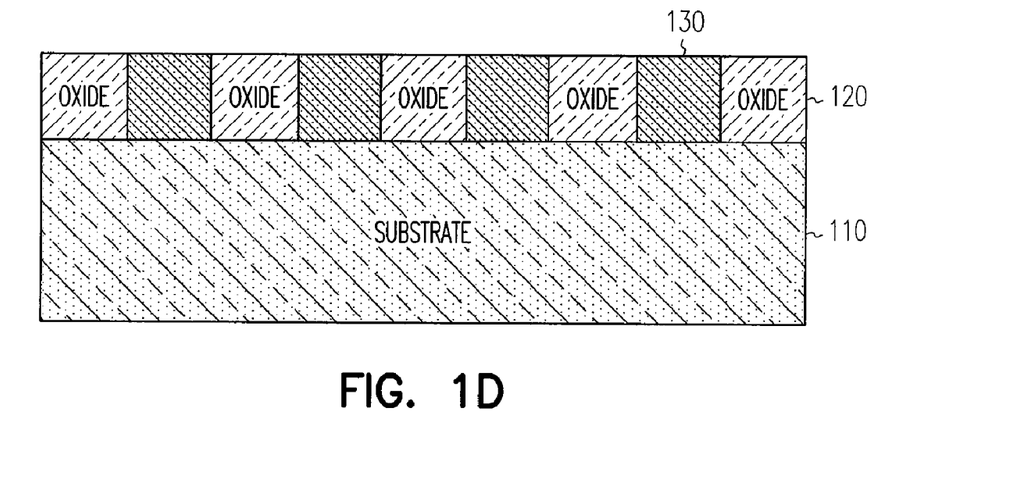

In FIG. 1B, a resist layer 115 is added to define the areas of oxide pillars to be formed. FIG. 1C illustrates forming recesses 125 in the oxide layer to create the oxide pillars 120. In an example, the recesses 125 are formed by selective etching. In some embodiments, the recesses 125 are trenches. FIG. 1D illustrates the resist layer 115 being removed and the recesses 125 filled with epi material to form vertical epitaxial isolation structures 130. In an example, the top surface of the oxide and the top surface of the epitaxial isolation structures are planarized to form a coplanar top surface. Because the epi layer reaches to the strained substrate 110, the substrate 110 acts as a seed crystal for the vertical structures 130. The result is that the crystal lattice of the vertical structures 130 is aligned with the crystal lattice of the strained substrate 110. Another result is that, in some embodiments, the epitaxy/oxide interface can be formed to be a substantially straight side. In some examples, the interface is substantially vertical. Moreover, the epitaxial vertical surface is defect free.

Selective epitaxial layers are formed using a molecular beam epitaxy (gas source or solid source) in an embodiment. In an embodiment, selective epitaxial layers are deposited using chemical vapor deposition processes that are adapted for selective epitaxy. More specifically, the selective epitaxy is deposited by atoms produced by a gas phase reaction striking the substrate surface or the prior deposited selective epitaxy film. The atoms move around the surface until they are correctly aligned and thus can bond to the exposed, previously formed silicon layer. Potential gas sources for silicon epitaxy include a hydrogen reduction of silicon tetrachloride ($SiCl_4$), silane ($SiH_4$), dichlorosilane ($SiH_2Cl_4$ or DCS), trichlorosilane (TCS), or other hydrogen reduced chlorosilanes ($SiH_xCl_{4-x}$). Descriptions of methods and devices that incorporate selective epitaxy deposition are found in commonly assigned, co-pending U.S. patent application Ser. No. 10/765,301, entitled "Selective Epitaxy Vertical Integrated Circuit Components and Methods," which is incorporated herein by reference.

Figure 2A:
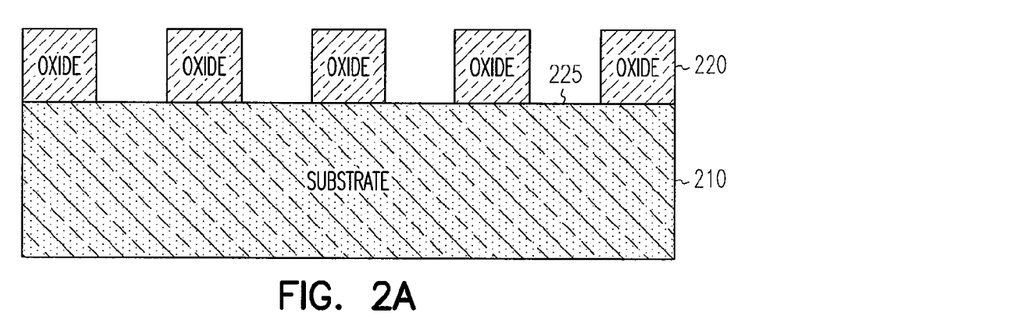
FIGS. 2A-D illustrate other embodiments of semiconductor layers used in fabricating a flash memory integrated circuit.
Figure 2B:
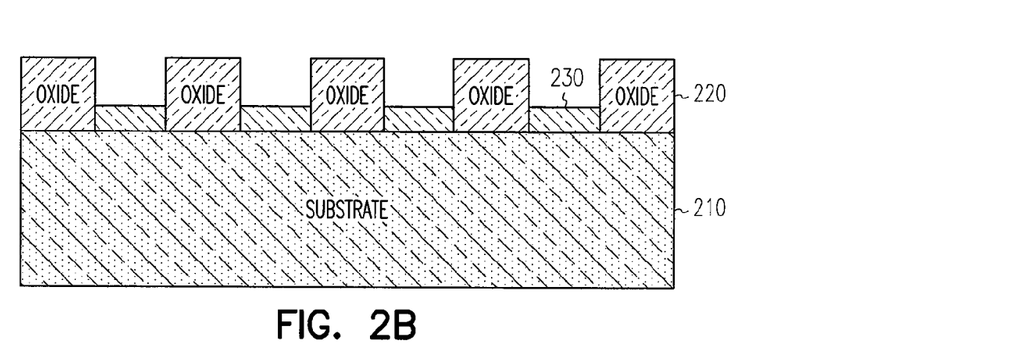
Figure 2C:
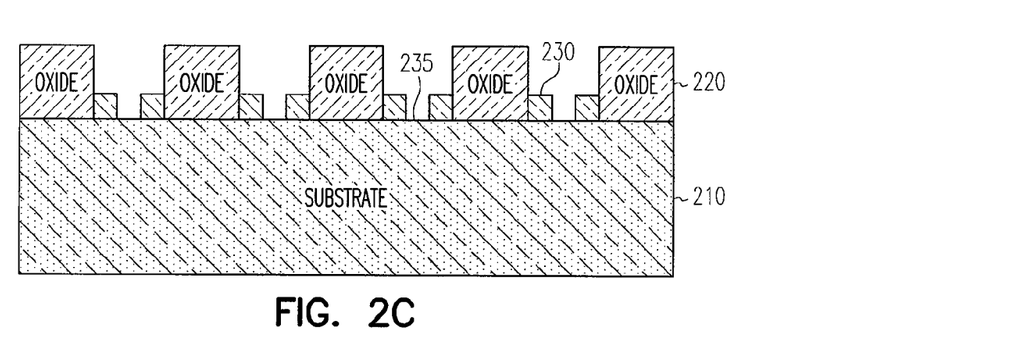
Figure 2D:
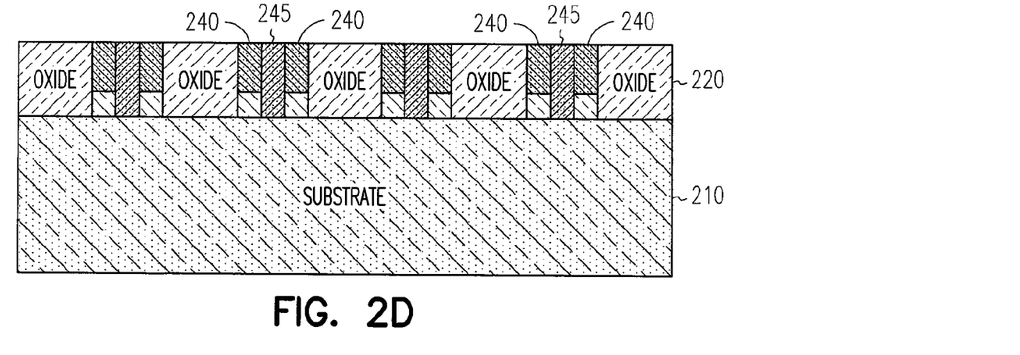

FIGS. 2A-D illustrate other embodiments of semiconductor layers used in fabricating an integrated circuit. In an example, the integrated circuit is at least part of a non-volatile memory or a flash memory. FIG. 2A shows oxide pillars 220 formed on a strained substrate 210 with recesses 225 between the pillars 220. In an example, the oxide is silicon dioxide ($SiO_2$). In FIG. 2B, a second oxide layer 230 is formed in the first recess 225. In FIG. 2C, a second recess 235 is formed in the first recess 225 through the second oxide layer 230 to the strained substrate 210. In an example, the second recess 235 is a trench. The Figure shows that the second recess 235 is narrower than the first recess 225 and that the oxide 230 remains between the second recess 235 and the oxide pillars 220. FIG. 2D shows the first and second recesses filled with epi material to form vertical epitaxial isolation structures 240, 245. Examples of epi material include silicon (Si), doped silicon, and silicon-germanium (SiGe). Two types of vertical epitaxial isolation structures are formed. Because the first type of vertical structure 240 does not reach the strained substrate 210, the substrate 210 does not act like a seed crystal for the vertical structures 240 and the crystal lattice of the first type of structures 240 is not aligned with the substrate 210. The second type of vertical epitaxial isolation structure 245 does reach the strained substrate 210 with the result that the substrate 210 acts like a seed crystal for the vertical structures 245 and the crystal lattice of the structures 245 is aligned with the crystal lattice of the strained substrate 210. Another result is that the aligned vertical epitaxial structures 245 are separated from the oxide pillars 220 by the non-aligned epitaxial structures 240. The aligned vertical epitaxial structures 245 can be made very narrow. In some examples, the width of the aligned vertical epitaxial structures 245 is about twenty nanometers (20 nm) or less. In some examples, the width is about thirty nanometers (30 nm) or less. In an embodiment, structures 240 are not epitaxial. In an embodiment, structures 240 form the region for the source/drains of the transistor portion of the non-volatile memory. That is, the top part of each structure 240 adjacent the gate oxide 220 is doped to form the respective source/drain region. The entire width of an upper portion of the structure 245 then acts as a channel for the subsequently formed transistor portion of the non volatile memory.

Figure 3A:
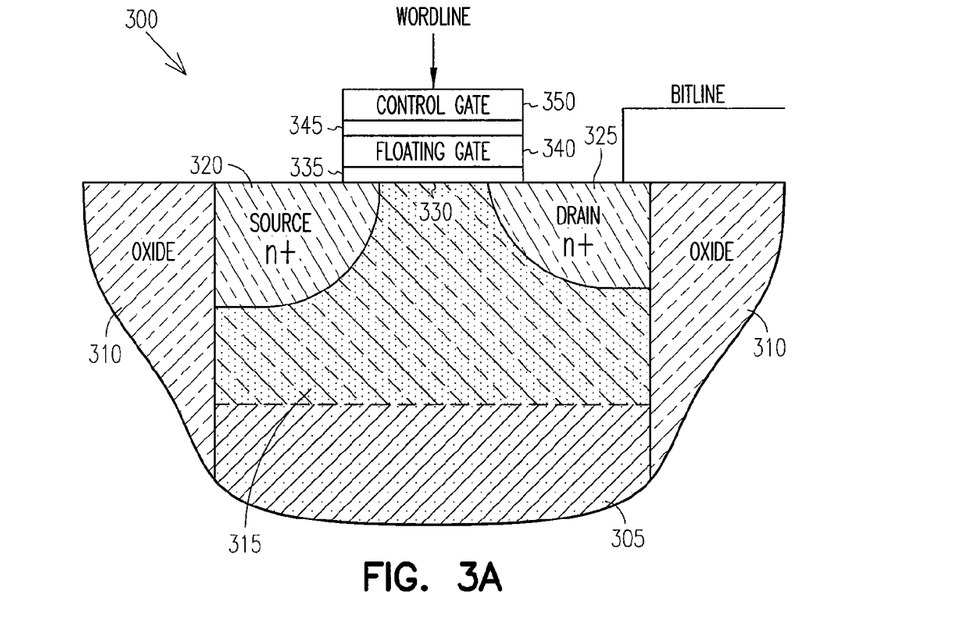
FIGS. 3A-B are illustrations of cross-sectional views of embodiments of parts of a floating gate transistor.
Figure 3B:
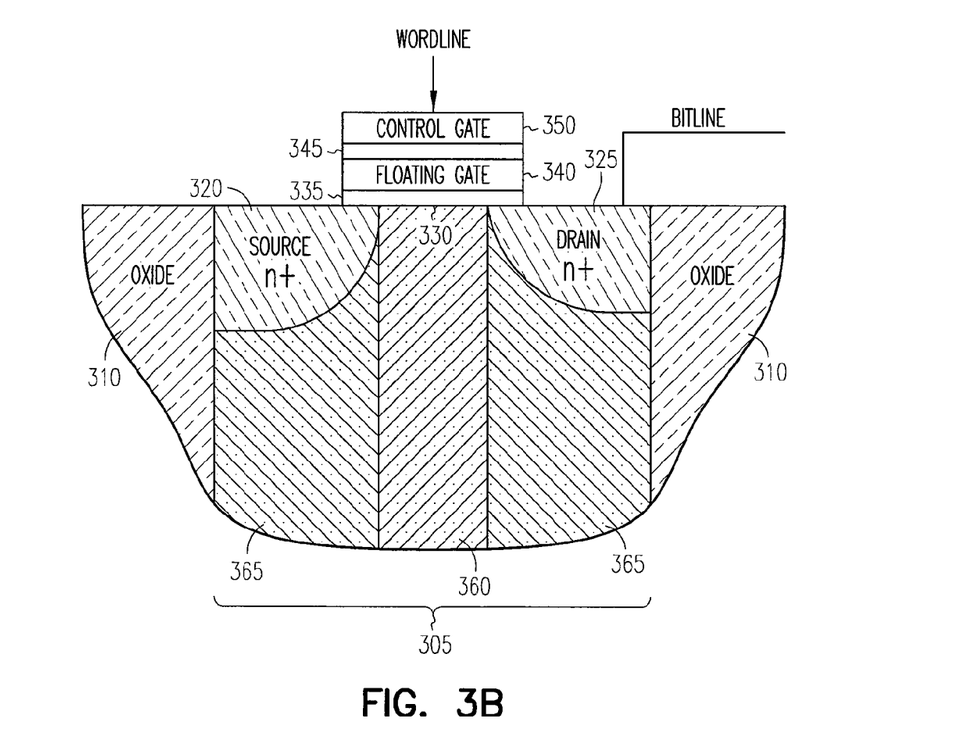

The vertical epitaxial isolation structures are useful in providing isolation for integrated circuits. For example, the vertical aligned structures isolate transistors formed in active regions formed in a region at the top of the vertical epitaxial isolation structures. This is because epi layers contain very few impurities giving these regions high resistivity. FIG. 3A is an illustration of a cross-sectional view of an embodiment of parts of a floating gate transistor 300 formed in a region of vertical epitaxial isolation structures 305 between oxide pillars 310. In some embodiments, the transistor 300 is included in a non-volatile memory cell. The memory cell includes a storage device (a capacitor) and an access device (a transistor). Isolation is necessary to prevent leakage current from bleeding off charge stored in the cell. In some embodiments the transistor is included in a flash memory cell. The transistor 300 is formed in an active region formed above a vertical isolation structure 305. The transistor 300 includes a source region 320 and a drain region 325 separated by a channel region 330 (an npn transistor is shown as an example which may include p-well 315). A gate formed above the channel region 330 includes a layer of tunnel oxide 335, floating gate 340, a dielectric layer 345, and a control gate 350. As examples, the tunnel oxide 335 includes a thin layer of $SiO_2$, the floating gate 340 and control gate 350 includes a layer of polysilicon, and the dielectric layer 345 includes a layer of oxide-nitride-oxide (ONO). A wordline for the memory cell is shown connected to the control gate 350 and a bitline is shown connected to the drain region 325. FIG. 3B is an illustration of an embodiment where the vertical epitaxial isolation structures 305 include aligned 360 and non aligned structures 365. The nonaligned structures 365 include the source region 320 and the drain region 325, and the aligned structure includes the channel region 330.

Figure 4:
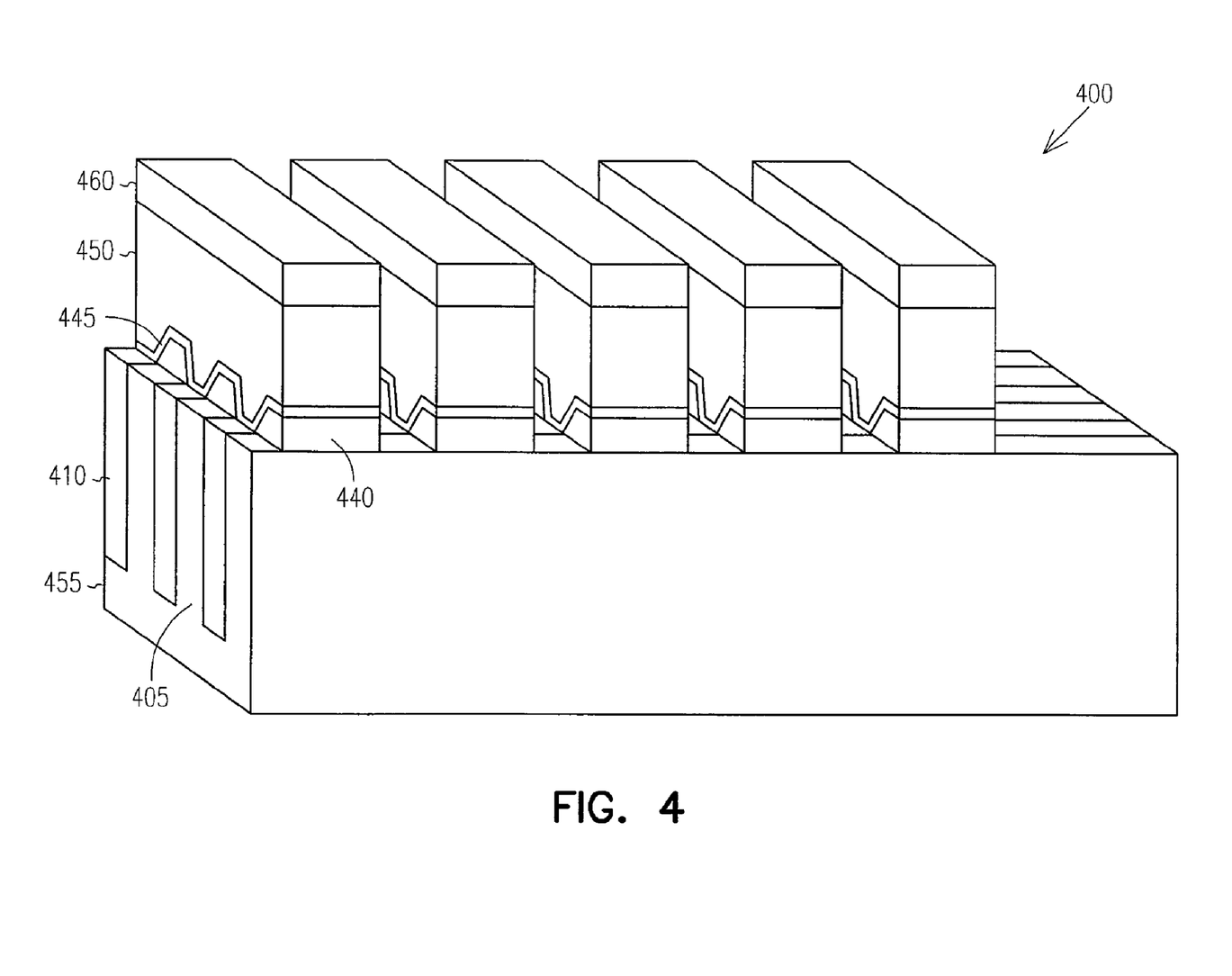
FIG. 4 is an illustration of parts of a series of five floating gate transistors.

FIG. 4 is an illustration of parts of a series of five floating gate transistors 400. Vertical isolation structures 405 aligned with a substrate 455 are formed between insulating oxide pillars 410. Gates are formed above channel regions (not shown to simplify the illustration) that include layers of tunnel oxide (not shown), floating gates 440, dielectric layers 445, control gates 450, and isolation layers 460. In some embodiments, the floating gate transistors are included in non-volatile memory cells, such as flash memory cells for example. In some embodiments, the floating gate transistors are included in an array of non-volatile memory cells. In an example, the control gate layers 450 of the transistors are connected to the wordlines of the memory cells and drain regions of the transistors are connected to bitlines of the memory cells.

According to some embodiments of a floating gate transistor, silicon nanocrystals are embedded in the dielectric layer between the control gate and the channel and are included in a floating gate. Silicon nanocrystals are used to control lateral movement of charge to other isolated nanocrystals. This allows smaller devices to be fabricated.

Figure 5A:
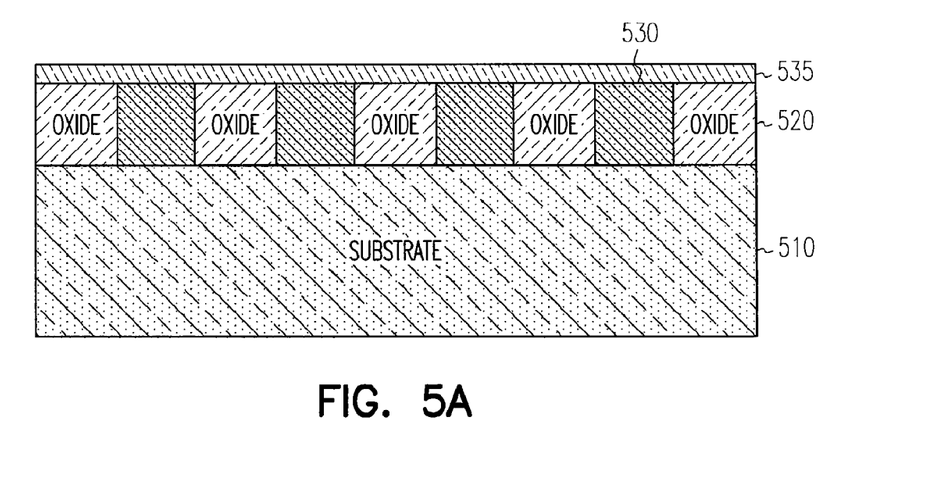
FIGS. 5A-C are illustrations of embodiments of semiconductor layers used in fabricating a transistor using a layer of silicon nanocrystals in the floating gate for a flash memory circuit.
Figure 5B:
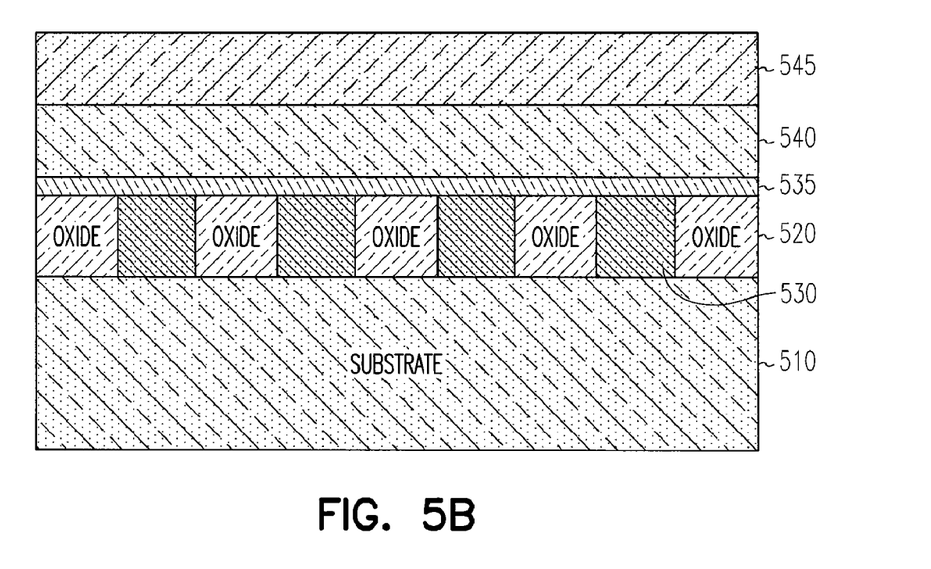
Figure 5C:
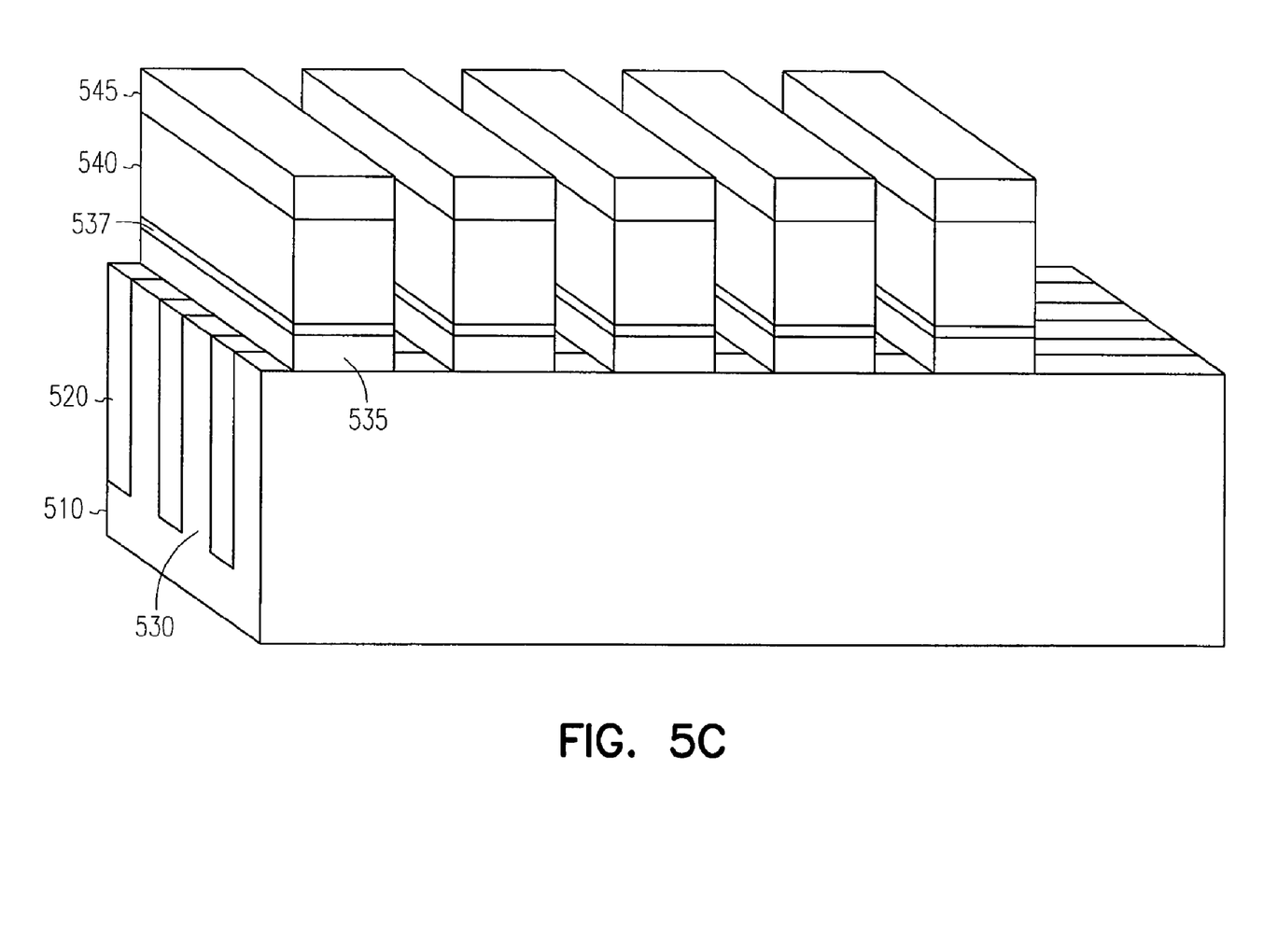

FIGS. 5A-C are illustrations of embodiments of semiconductor layers 500 used in fabricating a silicon nanocrystal floating gate transistor. FIG. 5A is a cross sectional illustration of vertical epitaxial isolation structures 530 aligned with a substrate 510 and formed between oxide pillars 520. In some embodiments, the substrate 510 is a strained substrate, e.g., a horizontally strained substrate. A floating gate layer 535 that includes a tunnel oxide and a nanocrystal layer is formed above the oxide pillars 520 and isolation structures 530. A dielectric layer (not shown) is formed above the floating gate layer 535. FIG. 5B shows a layer of control gate material 540 and an isolation layer 545 formed above the dielectric layer and the floating gate layer 535. FIG. 5C is an illustration of parts of a series of five floating gate transistors. Vertical isolation structures 530 aligned with a substrate 510 are formed between oxide pillars 520. Gates are formed above channel regions (not shown to simplify the illustration) that include floating gates 535 that in turn include a tunnel oxide and a nanocrystal layer, dielectric layers 537, control gates 540, and isolation layers 545. Transistors are formed in an active region defined at the top of the vertical isolation structures 530.

In some embodiments, the floating gate transistors 500 are included in non-volatile memory cells, such as flash memory cells. In some embodiments, the floating gate transistors 500 are included in an array of non-volatile memory cells. In some embodiments, the vertical isolation structures 530 include both aligned and non-aligned structures and the transistors 500 are formed in an active region above the aligned and non-aligned vertical structures.

Figure 6:
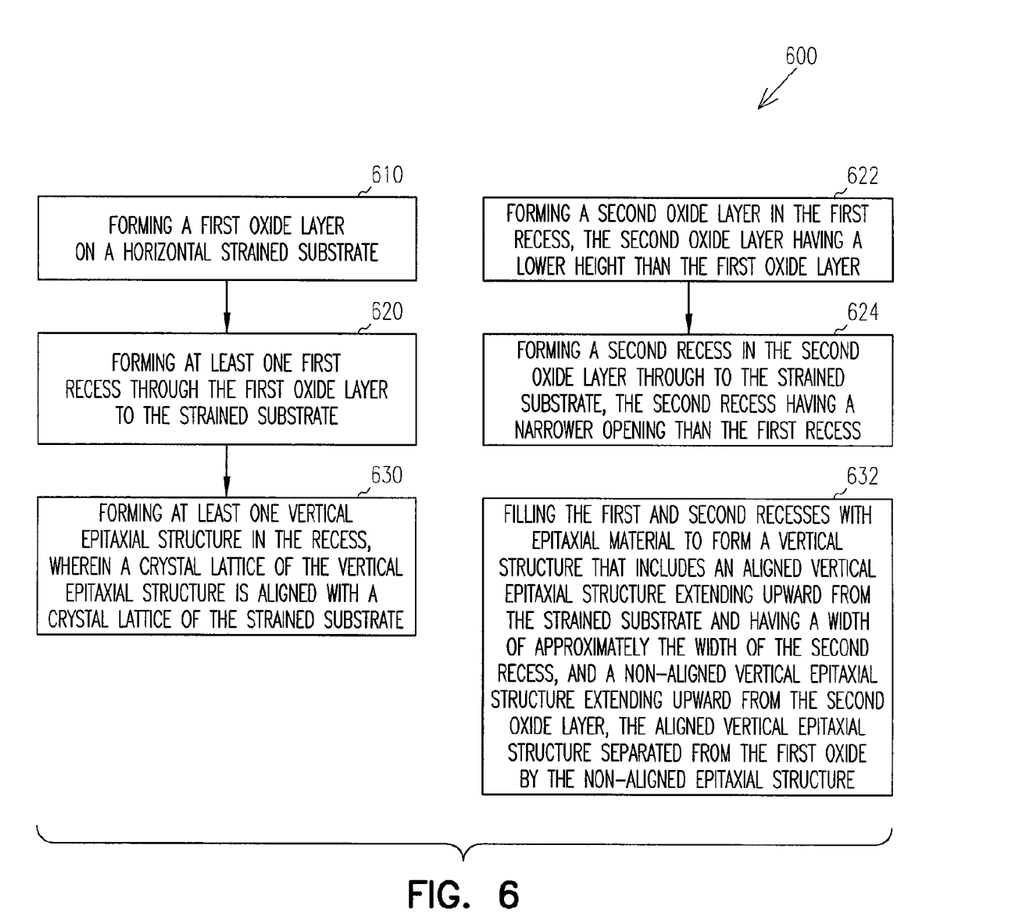
FIG. 6 is a flow chart that includes embodiments of methods used in forming the structures and circuits discussed herein.

FIG. 6 is a flow chart 600 that includes embodiments of methods used in forming the structures and circuits discussed previously. At 610, a first oxide layer is formed on a horizontal strained substrate. At 620, at least one recess is formed through the first oxide layer to the strained substrate. In an example, the recess is a trench formed by etching. At 630, at least one vertical epitaxial structure is formed in the recess. The crystal lattice of the vertical epitaxial structure is aligned with a crystal lattice of the strained substrate. In an example, the structure is formed by deposition of semiconductor material and growing the epitaxial structure using epitaxial growth techniques. Examples of epitaxial material include silicon (Si), doped silicon, and silicon-germanium (SiGe).

In some embodiments, the forming of at least one first recess through the oxide to the strained substrate at 620 further includes, at 622, forming a second oxide layer in the first recess such that the second oxide layer has a lower height than the first oxide layer and, at 624, forming a second recess in the second oxide layer through to the strained substrate such that the second recess has a narrower opening than the first recess. In the embodiments, the forming of at least one vertical epitaxial structure in the first recess at 630 further includes, at 632, filling the first and second recesses with epitaxial material to form a vertical epitaxial isolation structure. The resulting vertical structure includes two types of structures extending upward from the strained substrate: an aligned vertical epitaxial structure extending upward from the strained substrate and having a width of approximately the width of the second recess, and a non-aligned vertical epitaxial structure. The aligned vertical epitaxial structure is separated from the first oxide by the non-aligned epitaxial structure. In some embodiments, forming the resulting aligned vertical epitaxial structure includes forming the structure to have a width of about thirty nanometers (30 nm) or less. In some embodiments, the resulting aligned vertical epitaxial structure is formed to have a width of about twenty nanometers (20 nm) or less.

In some embodiments, the method 600 further includes forming at least one floating gate transistor in an active region defined within the vertical epitaxial structure. In some embodiments, forming such a transistor includes forming a floating gate of the transistor using a tunnel oxide layer and a silicon nanocrystal layer.

In a flash memory cell, a process known as Fowler-Nordheim tunneling is used to alter charge stored in the cell by injecting electrons through the control gate to the floating gate. Charge injection by the Fowler-Nordheim tunneling method from silicon into thermally grown silicon dioxide has been shown to be well behaved and results in stable device operation. One concern is that the method of forming the epi structure after the insulating oxide has been thermally grown and creating the active regions using epitaxial growth may result in anomalous tunneling characteristics at the epi/oxide interface. For this reason, some embodiments of the method 600 include heating and/or annealing after the epi/oxide interface is formed.

Figure 7:
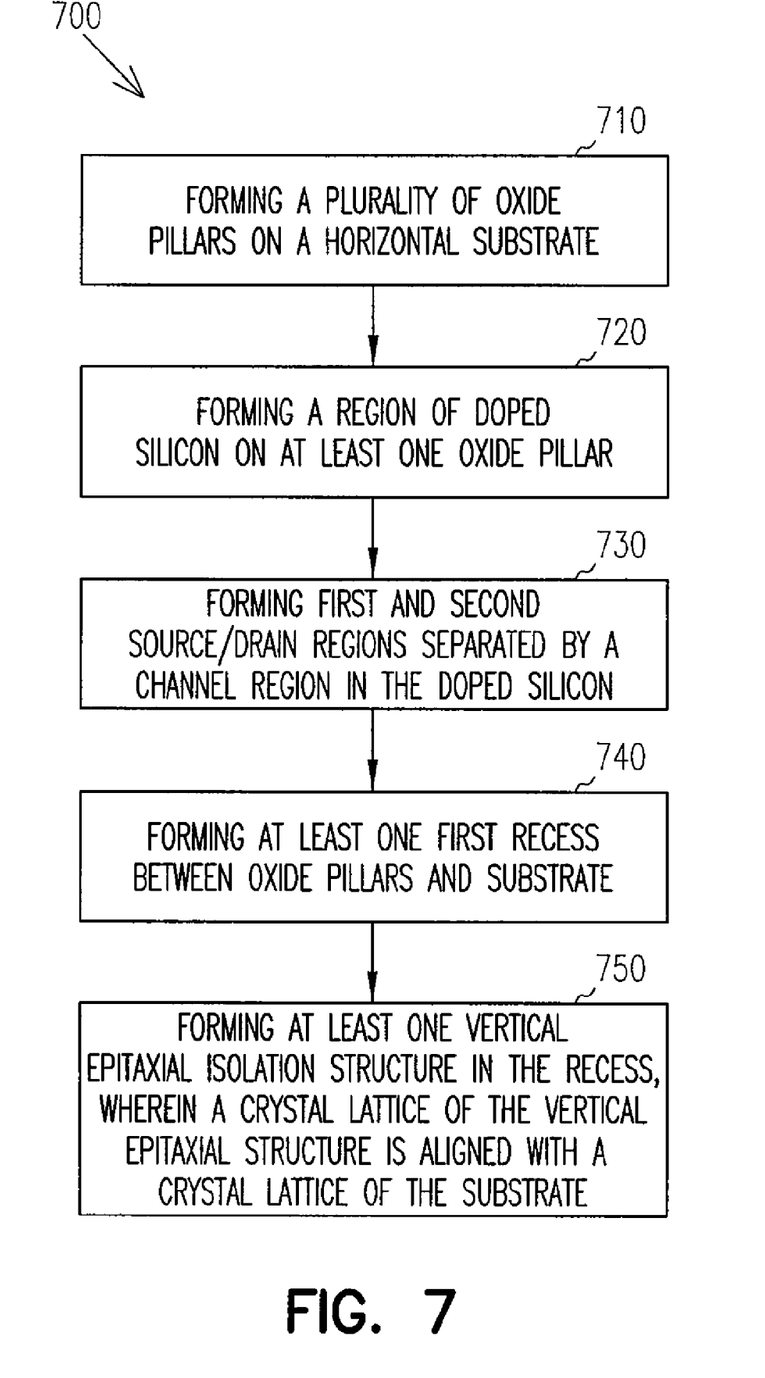
FIG. 7 is a flow chart that includes embodiments of another method used in forming the structures and circuits discussed herein.

FIG. 7 is a flow chart 700 that includes embodiments of another method used in forming the structures and circuits discussed previously. At 710, a plurality of insulating oxide pillars are formed on a horizontal substrate. In some embodiments, the pillars are formed on a strained substrate. At 720, at least one recess is formed between the oxide pillars. At 730, at least one vertical epitaxial isolation structure is formed in the recess such that a crystal lattice of the vertical epitaxial structure is aligned with a crystal lattice of the substrate. At 740, an active region is defined within the vertical epitaxial structure. At 750, first and second source/drain regions are formed separated by a channel region in the active region.

In some embodiments, the vertical epitaxial isolation structure includes both aligned and nonaligned structures. The region above the aligned vertical isolation structure is masked and doped silicon is diffused into the region defined by an oxide pillar and nonaligned vertical structures. The first and second source/drain regions include the nonaligned structures and the channel region includes the aligned structure.

Figure 8:
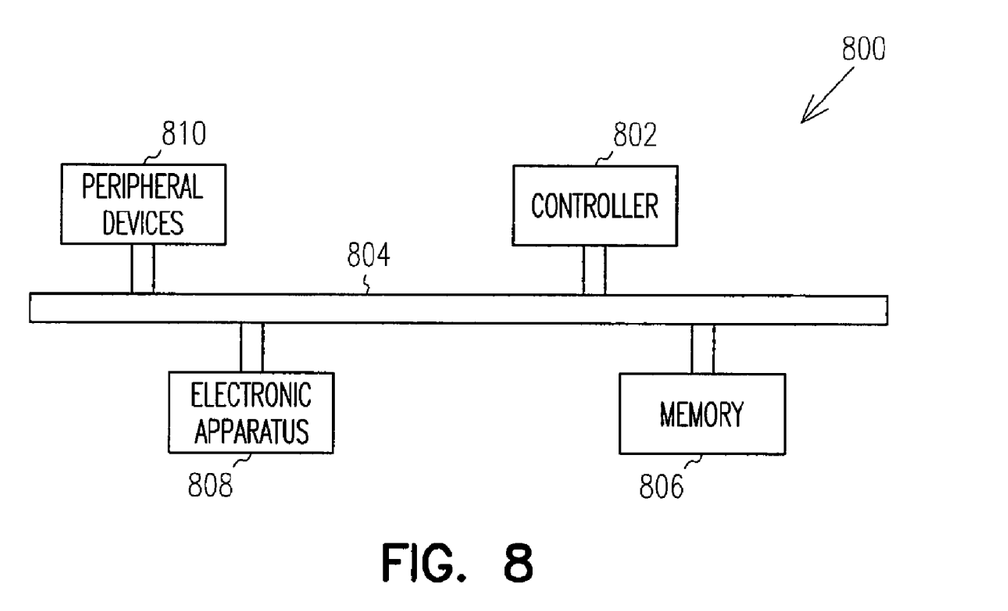
FIG. 8 is a block diagram of portions of a system having a flash memory integrated circuit.

FIG. 8 depicts a block diagram of an embodiment of a system 800 having a controller 802 and a memory 806. Controller 802 and/or memory 806 include a flash memory circuit as described herein. System 800 also includes an electronic apparatus 808, and a bus 804, where bus 804 may provide electrical conductivity and data transmission between controller 802 and electronic apparatus 808, and between controller 802 and memory 806. Bus 804 may include an address, a data bus, and a control bus, each independently configured. Bus 804 also uses common conductive lines for providing address, data, and/or control, the use of which may be regulated by controller 802. In an embodiment, electronic apparatus 808 includes additional memory devices configured similarly to memory 806. An embodiment includes an additional peripheral device or devices 810 coupled to bus 804. In an embodiment controller 802 is a processor. Any of controller 802, memory 806, bus 804, electronic apparatus 808, and peripheral device or devices 810 may include a flash memory in accordance with the disclosed embodiments. System 800 may include, but is not limited to, information handling and telecommunication systems, and computers. Peripheral devices 810 may include displays, additional storage memory, or other control devices that may operate in conjunction with controller 802 and/or memory 806.

The methods and devices described are useful to provide isolation for integrated circuits. They are also useful to control parasitic capacitance from one device to the next. This is because the width of the aligned epitaxial structures can be made small enough and accurate enough to control leakage current between adjacent devices; i.e., they can be used to prevent the leakage current as well as to tailor the amount of leakage current.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations, or variations, or combinations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own.

What is claimed is:

1. A method of forming a portion of a non-volatile memory cell comprising:
    forming a first oxide layer on a horizontally strained substrate;
    forming at least one first recess through the first oxide layer to the strained substrate; and
    forming at least one vertical epitaxial structure in the recess, wherein a crystal lattice of the vertical epitaxial structure is aligned with a crystal lattice of the strained substrate.

2. The method of claim 1, wherein forming at least one first recess through the oxide to the strained substrate further includes:
    forming a second oxide layer in the first recess, the second oxide layer having a lower height than the first oxide layer;
    forming a second recess in the second oxide layer through to the strained substrate, the second recess having a narrower opening than the first recess;
    wherein forming at least one vertical epitaxial structure in the first recess further includes filling the first and second recesses with epitaxial material to form a vertical structure; and
    wherein the vertical structure includes an aligned vertical epitaxial structure extending upward from the strained substrate and having a width of approximately the width of the second recess, and a non-aligned vertical epitaxial structure extending upward from the second oxide layer, the aligned vertical epitaxial structure separated from the first oxide by the non-aligned epitaxial structure.

3. The method of claim 2, wherein forming the vertical epitaxial structure includes forming the aligned vertical epitaxial structure having a width of about twenty nanometers (20 nm) or less.

4. The method of claim 1 further including forming at least one floating gate transistor in an active region defined within the vertical epitaxial structure.

5. The method of claim 4, wherein forming at least one floating gate transistor includes forming a floating gate of the transistor using a tunnel oxide layer and a nanocrystal layer above the vertical epitaxial structure.

6. The method of claim 1, including forming the horizontally strained substrate by forming a silicon substrate on a first silicon germanium substrate that has a dissimilar lattice structure from the silicon substrate.

7. The method of claim 1 including forming the horizontally strained substrate by forming the strained substrate in a volume small enough to change a crystal lattice of the substrate.

8. The method of claim 1, wherein forming at least one vertical epitaxial structure includes forming the vertical epitaxial structure using a molecular beam epitaxy.

9. The method of claim 1, wherein forming at least one vertical epitaxial structure includes depositing selective epitaxial layers using a chemical vapor deposition process.

10. The method of claim 1, including at least one of heating and annealing the substrate after an epitaxy-oxide interface is formed.

11. A method of forming a flash memory cell comprising:
    forming a plurality of oxide pillars on a horizontally strained substrate;
    forming at least one first recess between oxide pillars to the substrate;
    forming at least one vertical epitaxial isolation structure in the recess, wherein a crystal lattice of the vertical epitaxial structure is aligned with a crystal lattice of the substrate;
    forming an active region within the vertical epitaxial structure; and
    forming first and second source/drain regions separated by a channel region in the active region.

12. The method of claim 11, wherein forming at least one first recess through the oxide to the strained substrate further includes:
  forming an oxide layer in the first recess, the oxide layer having a lower height than the oxide pillars; and
  forming a second recess in the oxide layer through to the substrate, the second recess having a narrower opening than the first recess; and wherein forming a vertical epitaxial structure in the first recess further includes filling the first and second recesses with epitaxial material to form a vertical structure, the vertical structure including:
    an aligned vertical epitaxial structure extending upward from the substrate and having a width of approximately the width of the second recess; and
    a non-aligned vertical epitaxial structure extending upward from the second oxide layer, the aligned vertical epitaxial structure separated from the oxide pillars by the non-aligned epitaxial structure.

13. The method of claim 12, wherein forming the vertical epitaxial structure includes forming the aligned vertical epitaxial structure having a width of about twenty nanometers (20 nm) or less.

14. The method of claim 11, further including forming at least one floating gate transistor in an active region defined within the vertical epitaxial structure.

15. The method of claim 14, wherein forming at least one floating gate transistor includes forming a floating gate of the transistor using a tunnel oxide layer and a nanocrystal layer above the vertical epitaxial structure.

16. The method of claim 14, wherein forming a floating gate transistor includes forming a gate having a floating gate, a dielectric layer, and a control gate, wherein the dielectric layer includes oxide-nitride-oxide (ONO).

17. A method of forming a transistor in a memory circuit comprising:
  forming a layer of insulating oxide on a horizontally strained substrate;
  forming at least one vertical epitaxial isolation structure extending from the strained substrate through the layer of insulating oxide, wherein the vertical epitaxial structure is aligned with a crystal lattice of the substrate;
  forming an active region within the vertical epitaxial structure;
  forming a first source/drain region adjacent a first wall of the insulating oxide layer;
  forming a second source/drain region adjacent a second wall of the insulating oxide layer; and
  forming a channel region between the first source/drain region and the second source/drain region.

18. The method of claim 17, including forming a gate above the channel region,
  wherein forming the gate includes forming a floating gate, a dielectric layer, and a control gate above the channel region, and
  wherein the forming the floating gates includes forming a tunnel oxide layer and a nanocrystal layer above the tunnel oxide layer.

19. The method of claim 18, wherein forming a dielectric layer includes forming a dielectric layer that includes a layer of oxide-nitride-oxide (ONO).

20. The method of claim 17, wherein forming the vertical epitaxial isolation structures includes:
  forming a first portion having a lattice aligned with the substrate lattice extending vertically from the substrate through an insulating oxide layer formed on the substrate; and
  forming second and third portions having a non-aligned lattice extending vertically from a second oxide layer having a height lower than the insulating oxide layer, wherein the non-aligned portions separate the aligned portion from the insulating oxide layer; and
  wherein forming the channel region includes forming the channel region in the first portion, wherein forming the first source/drain region includes forming the first source/drain region in the second portion, and
wherein forming the second source/drain region includes forming the second source/drain region in the third portion.

* * * * *